United States Patent [19]

Kase

[11] Patent Number: 5,559,500
[45] Date of Patent: Sep. 24, 1996

[54] OVERCURRENT SENSE CIRCUIT

[75] Inventor: Kiyoshi Kase, Chiba, Japan

[73] Assignee: Motorola, Inc., Schaumburg, Ill.

[21] Appl. No.: 401,751

[22] Filed: Mar. 9, 1995

[30]     Foreign Application Priority Data

Mar. 11, 1994 [JP] Japan .................................. 6-067697

[51] Int. Cl.$^6$ .................................................. G08B 21/00
[52] U.S. Cl. ........................ 340/664; 324/126; 324/522; 361/98; 323/315
[58] Field of Search ........................... 340/664; 324/126, 324/522, 555, 713; 361/18, 93, 98, 100; 323/315; 379/24, 30, 385

[56]              References Cited

U.S. PATENT DOCUMENTS

| | | | |
|---|---|---|---|
| 3,663,863 | 5/1972 | Arimura et al. | 361/98 |
| 3,831,160 | 8/1974 | Cronin et al. | 340/664 |
| 3,886,932 | 6/1975 | Suessmith | 340/664 |
| 4,223,365 | 9/1980 | Moran | 340/664 |
| 4,951,171 | 8/1990 | Tran et al. | 361/93 |
| 5,089,926 | 2/1992 | Kugelman | 340/664 |

*Primary Examiner*—John K. Peng
*Assistant Examiner*—Daniel J. Wu
*Attorney, Agent, or Firm*—Harry A. Wolin; Rennie William Dover

[57]              ABSTRACT

An overcurrent is detected with small power consumption and at a high level of accuracy. A first transistor section 3 comprised of one NPN transistor 31 and a second transistor section 4 comprised of four NPN transistors 41–44 having the same characteristics as those of the transistor 31 are connected across a current sense resistor 2, with their emitters connected to the resistor 2. The transistors 31 and 41–44 have their bases commonly connected, with a voltage applied between their base and emitter by a voltage application unit 5, and have their collectors connected to transistors 61 and 62 which form a current mirror circuit. Once a bandgap voltage, $\Delta V_{BE}$, i.e., a voltage difference between the base-emitter voltages of the transistor sections 3 and 4, is determined, the current density ratio of both the transistor sections 3 and 4 is determined, which is used to detect an overcurrent.

4 Claims, 3 Drawing Sheets

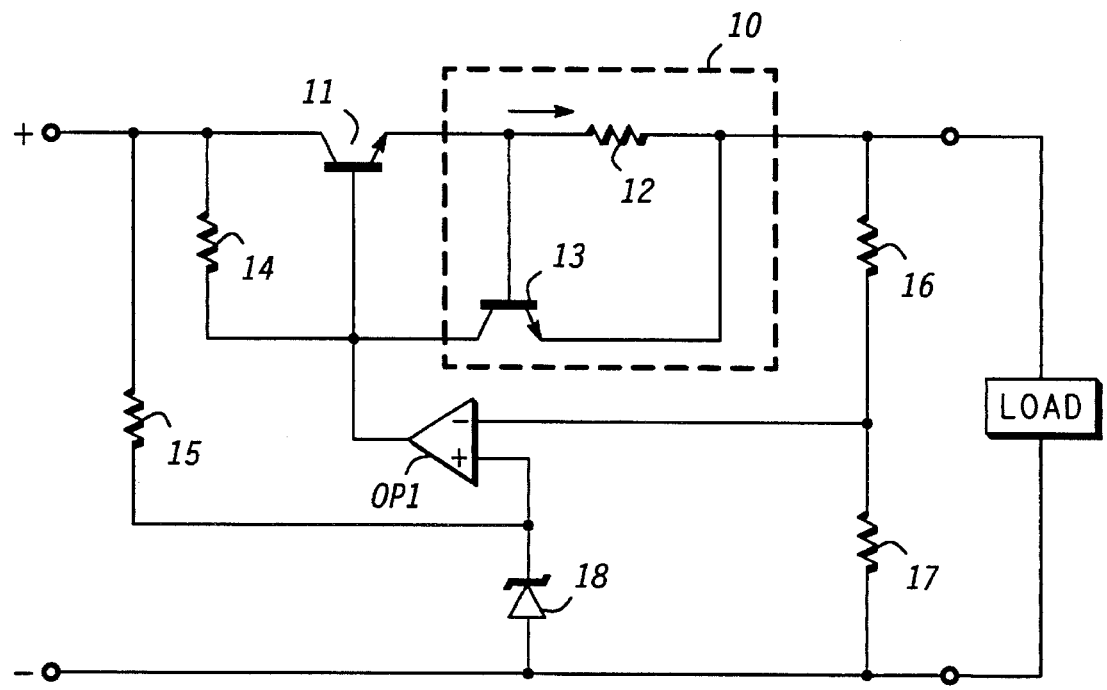
FIG. 1
-PRIOR ART-
FIG. 2
-PRIOR ART-
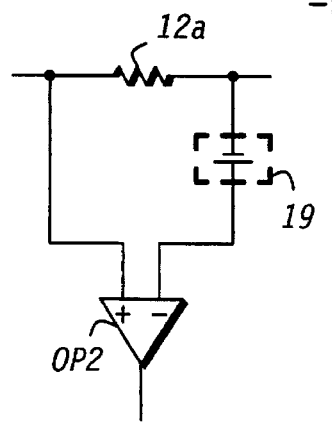

OVERCURRENT SENSE CIRCUIT

FIELD OF THE INVENTION

The present invention relates to an overcurrent sense circuit incorporated into, for example, constant-voltage power supplies, constant-current power supplies, power supply protection circuits, and current measurement circuits, said overcurrent sense circuit consuming little power and also capable of detecting overcurrent with a high degree of accuracy.

BACKGROUND OF THE INVENTION

Typically, an overcurrent sense circuit of this type is used to source a portion of the current to a bypass side when an overcurrent flows through the circuit, thereby protecting current control elements such as power transistors, or to stop power from a power supply to a load to protect a battery.

FIG. 1 shows a constant-current power supply incorporating a prior overcurrent sense circuit 10, where an op-amp OP1 controls an NPN power transistor 11 to maintain a constant current to the load. The overcurrent sense circuit 10 is arranged so that a current sense resistor 12 is inserted in a conduction path drawing a load current, and is connected between a base and an emitter of an NPN power transistor 13 provided in a bypass circuit. Note that reference numerals 14–17 and 18 in the figure denote resistors and a zener diode, respectively. According to such an overcurrent sense circuit, when an overcurrent flows in the current sense resistor 12 due to a state of the load, for example, the power transistor 13 is turned on, so that a portion of the current from the power supply end flows as a collector current via the power transistor 13, thereby protecting the power transistor 11.

FIG. 2 shows another example of the overcurrent sense circuit that can be substituted for the one shown in FIG. 1; in this example, both inputs of an op-amp OP2 that forms a voltage comparator are connected across both ends of a current sense resistor 12a, while a reference power supply 19 is inserted on the negative input end of the op-amp OP2, so that when an overcurrent flows in the current sense resistor 12a, the op-amp OP2 is activated to output a sense signal.

A disadvantage of the overcurrent sense circuit shown in FIG. 1 is that about 0.7 volts is needed to turn on the bipolar transistor 13, therefore significant power is consumed at the current sense resistor 12. Furthermore, because the voltage between the base and emitter of the bipolar transistor has a negative temperature characteristic, the current sense resistor 12 must have a similar negative temperature characteristic in order to accurately sense an overcurrent, so that special resistor materials are required for the current sense resistor.

Additionally, with the arrangement shown in FIG. 2, a voltage comparator OP2 and reference power supply 19 with a very small offset voltage are required to sense a current at a low voltage drop. For example, if the voltage across the current sense resistor 12a is set to detect an overcurrent at 100 mV and an offset voltage of 10 mV is used for the voltage comparator OP2, then the current that can be actually sensed contains 10% error relative to the set current, even in consideration of the offset voltage only; when the offset voltage for the reference power supply is included, the error is further increased, so that the overcurrent cannot be sensed with a high degree of accuracy. Additionally, because the temperature coefficients for the reference power supply 19 and resistor 12a must be matched, there is small latitude in choice of the resistor 12a.

Thus, it is an object of the present invention to provide an overcurrent sense circuit that consumes less power and can sense an overcurrent with a high degree of accuracy.

SUMMARY OF THE INVENTION

The present invention is intended to detect an overcurrent by use of $\Delta V_{BE}$, with an eye toward the facts that assuming that the base-emitter voltages of two transistors are $V_{BE1}$ and $V_{BE2}$, respectively, then the voltage difference therebetween (bandgap voltage) $\Delta V_{BE}$ can be sensed based on the collector current of each transistor, that temperature characteristics of the power supply that applies voltage to both transistors are not introduced into $\Delta V_{BE}$, and that $\Delta V_{BE}$ is proportional to absolute temperature. With reference to FIG. 3, according to the present invention, an overcurrent sense circuit for detecting when an overcurrent flows in a load current conduction path 1 is provided, said overcurrent sense circuit comprising:

a current sense resistor 2 provided in said conduction path 1;

a first transistor section 3, comprised of a bipolar transistor Tr, having its emitter connected to a load end of the current sense resistor 2;

a second transistor section 4, comprised of bipolar transistors Tr, having their emitters connected to a supply end of the current sense resistor 2 and their bases commonly connected to a base of the first transistor section 3;

a voltage application unit 5 for applying a voltage between each base and emitter of the first and second transistor sections 3 and 4; and a sensor 6 for detecting the overcurrent as a voltage across the current sense resistor 2, based on the collector current of the first transistor section 3 and the collector current of the second transistor section 4.

With the present invention, although the first and second transistor sections 3 and 4 may be arranged similarly, the effective emitter areas of the transistor sections 3 and 4 may be different, and both transistors sections 3 and 4 may use transistors Tr with the same characteristic, having different numbers of transistors (FIG. 3). Note that the effective emitter area is an area of the region in the emitter contact surface with the base where the current flows. With the present invention, field-effect transistors may be used in place of the bipolar transistors used in the transistor sections 3 and 4.

Operation

The bandgap voltage, $\Delta V_{BE}$, shown in FIG. 3 is given by Eq. (1):

$$\Delta V_{BE}=(KT/q) \ln (N) \tag{1}$$

where, for the sake of simplicity, it is assumed that both transistor sections 3 and 4 have equal current gain.

Symbols K, T, q, and N represent Boltzmann's constant, operational absolute temperature, an amount of electron charge, and an emitter current density ratio of the transistor section 3 to the transistor section 4, respectively. For T=300° K., values of $\Delta V_{BE}$ for typical values of N are as follows:

| N | $\Delta V_{BE}$ (mV) |
|---|---|
| 2 | 18.022 |
| 3 | 25.564 |
| 4 | 36.044 |
| 5 | 41.845 |
| 6 | 46.585 |
| 7 | 50.594 |
| 8 | 54.065 |

Thus, in the arrangement shown in FIG. 3, $\Delta V_{BE}$ is of magnitude corresponding to N. By selecting the current sense resistor 2 so that it is approximately 0 volts when a typical load current flows therethrough, the ratio of the current densities of the transistor sections 3 and 4 is approximately 1:1 when the typical load current flows therethrough. As the load current becomes larger, $\Delta V_{BE}$ rises, and the current density ratio of the transistors 3 and 4 is proportional to $\Delta V_{BE}$ at that time. If $\Delta V_{BE}$ is 36.044 mV, for example, the current density ratio of the transistor sections 3 and 4 is 4:1. In this case, if the emitter area ratio of the transistor sections 3 and 4 is 1:4, for example, and if the first transistor section 3 is formed of one transistor Tr, while the second transistor section 4 is formed of four transistors Tr with the same characteristic as that of the transistor Tr of the first transistor section 3, then a current of the same magnitude flows through both of the transistors Tr. That is, when a normal load current flows through the current sense resistor 2, an approximately same magnitude of current flows through each transistor Tr and eventually $I_1:I_2=1:4$, because the base-emitter voltages of each of the transistors Tr in the transistor sections 3 and 4 are nearly the same; however, when $\Delta V_{BE}$ is 36.04 mV as an overcurrent flows, $I_1:I_2=1:1$ (i.e., the current density ratio of the transistor sections 3 and 4 is 4:1).

This is graphically plotted in FIG. 4, where the vertical and horizontal axes represent a collector current and a base-emitter voltage of each transistor Tr, respectively; for a normal load current, the base-emitter voltage of each transistor Tr is denoted by $V_{BEa}$ and the collector current is represented by ia; however, when an overcurrent flows through the current sense resistor 2, the base-emitter current of the transistor Tr in the second transistor section is $V_{BEa}$ less $\Delta V_{BE}$, i.e., $V_{BEb}$, with the collector current reduced from ia to ib. In the above case, ib is one-fourth ia, with $I_1=I_2$. Thus, if the sensor 6 is implemented to detect $I_1=I_2$, overcurrent can be detected. It should be noted, however, that the present invention is not limited to the arrangement that detects the overcurrent when $I_1=I_2$, but the sensor 6 may be configured to operate in a predetermined manner, e.g., to block the load current, when the ratio of $I_1$ and $I_2$ reaches a predetermined value.

Furthermore, because $\Delta V_{BE}$ is proportional to absolute temperature and has a positive temperature coefficient as is clear from Eq. (1), a great deal of latitude is available in material choice for the current sense resistor; by utilizing copper as a resistor, for example, which has a temperature coefficient close to $\Delta V_{BE}$ as described later, accurate overcurrent detection can be implemented regardless of temperature. Note that transistors used in the transistor sections 3 and 4 are not limited to bipolar transistors, but field-effect transistors, e.g., MOS transistors, may be used, and a difference $\Delta V_{GS}$ between the gate-source voltage of the first transistor section 3 and the gate-source voltage of the second transistor section 4 may be utilized to sense an overcurrent similarly to the manner described above.

BRIEF DESCRIPTION OF THE DRAWINGS

FIG. 1 is a circuit diagram showing one example of a prior overcurrent sense circuit.

FIG. 2 is a circuit diagram showing another example of a prior overcurrent sense circuit.

DESCRIPTION OF THE PREFERRED EMBODIMENT

Figure 3:
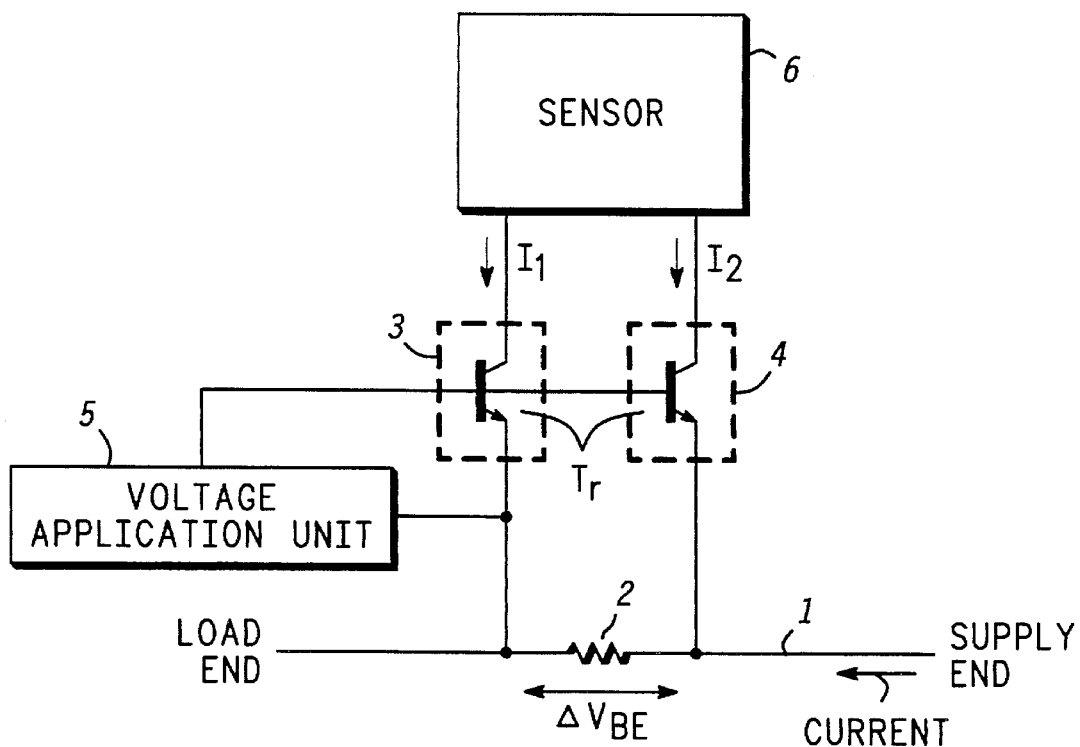
FIG. 3 is a circuit diagram of an overcurrent sense circuit in accordance with an embodiment of the present invention.
Figure 4:
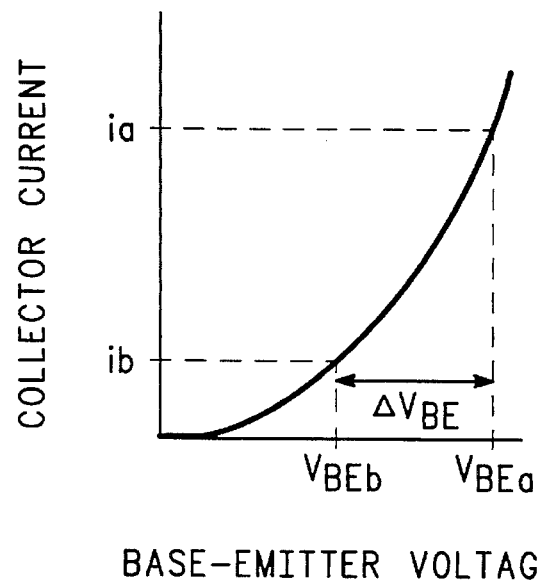
FIG. 4 is a plot of a characteristic curve for explaining the operation of the invention, where the relationship between the base-emitter voltage and collector current of the transistor is depicted.
Figure 5:
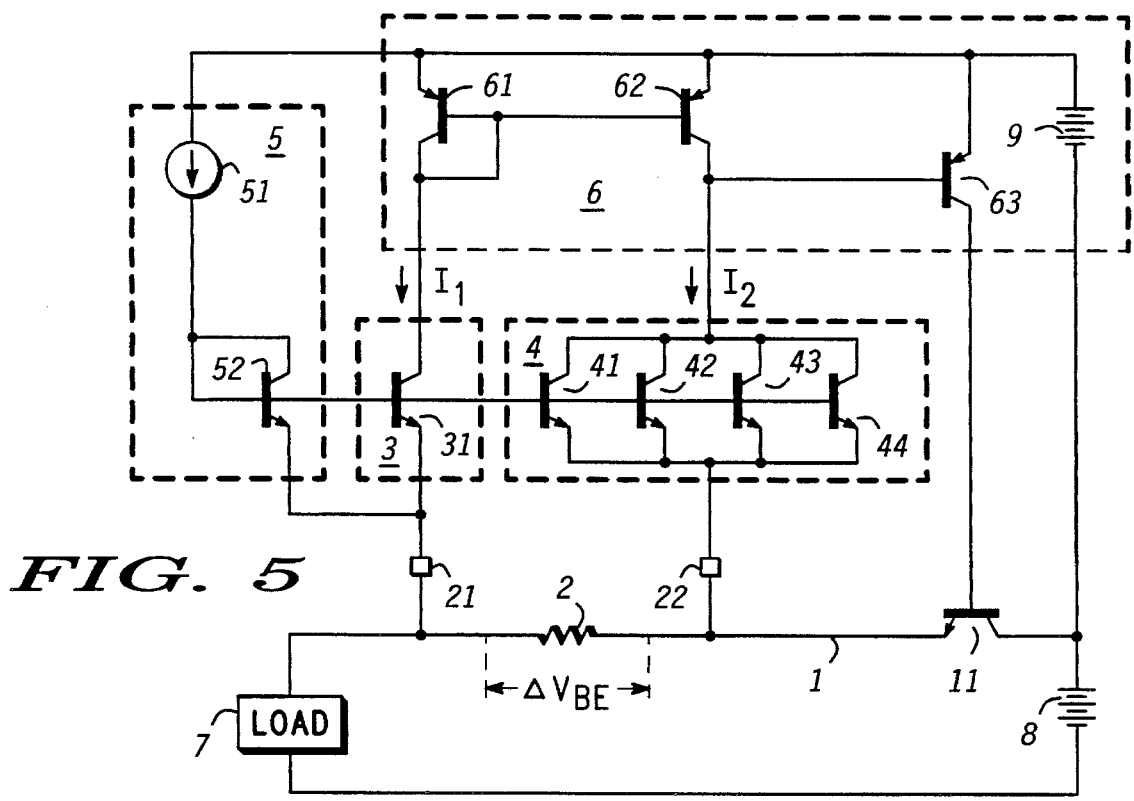
FIG. 5 is a schematic diagram of an overcurrent sense circuit in accordance with another embodiment of the present invention.

FIG. 5 is a circuit diagram showing one embodiment of the present invention. With this embodiment, transistor sections 3 and 4, voltage application unit 5 and sensor 6 are integrated into a single IC, which is connected via terminals (pads) 21 and 22 to a current sense resistor 2 comprised of a copper foil formed on a printed circuit board as described later. Reference numeral 7 in FIG. 5 denotes a load, such that power is supplied via a power transistor 11 for current control to a main power supply 8, e.g., a lithium-ion secondary battery.

The first transistor section 3 is comprised of one NPN transistor 31, a collector of which is connected to a collector of a PNP transistor 61, while an emitter of the transistor 31 is connected via a terminal 21 to the load 7 of the current sense resistor 2. The second transistor section 4 is comprised of four NPN transistors 41–44 with the same characteristics as those of the transistor 31, collectors of the transistors 41–44 are commonly connected to a collector of a PNP transistor 62, while emitters of the transistors 41–44 are connected via a terminal 22 to a power supply end of the current sense resistor 2. The PNP transistors 61 and 62 have their bases connected together, while their emitters are connected to a positive end of the controlling power supply 9, and the base of the transistor 61 is connected to the collector thereof, thereby forming a mirror circuit.

To the collector of the transistor 62 is connected a base of a PNP transistor 63 for controlling the power transistor 11, while an emitter and a collector of the transistor 63 are connected to the positive end of the controlling power supply 9 and the base of the power transistor 11, respectively. In the present embodiment, the sensor 6 is comprised of a current mirror circuit formed of the transistors 61 and 62, the transistor 63, and the controlling power supply 9.

A series circuit of the constant-current source 51 and NPN transistor 52 is connected in parallel to a series circuit of the transistors 61 and 31. The emitter of the transistor 52 is connected to the emitter of the transistor 31 of the first transistor section 3, while the collector of the transistor 52 is connected to its base. Furthermore, the base of the transistor 52 is connected to the bases of the transistor 31 of the first transistor section 3 and the transistors 41–44 of the second transistor section 4, so that the transistor 52, together with the other transistors 31 and 41–44, forms a current mirror circuit. The constant-current source 51 and transistor 52 form the voltage application unit 5 that applies a voltage, say, about 0.6 V, between the base and emitter of the transistor sections 3 and 4.

Now, the operation of the above embodiment is described. Assuming that the preset value of overcurrent is 10 A, for example, then the ratio of current $I_1$ flowing through the first transistor section 3 to current $I_2$ flowing through the second transistor section 4 is a value corresponding to $\Delta V_{BE}$ at that time, if the load current flowing through the conduction path 1 is less than 10 A. If the load current is as small as about 1 A, for example, because the resistance value of the current sense resistor 2 is very small, the voltage thereacross is approximately zero, so that the base-emitter voltages of the transistor 31 and transistors 41–44 are nearly equal. Thus, because the collector currents flowing through the transistors 31 and 41–44 are nearly equal, $I_2$ has about four times the magnitude of $I_1$. In addition, since the transistors 61 and 62 form a current mirror circuit, so the same current tends to flow therethrough, the current is eventually drawn from the transistor 63 to the second transistor section 4. At that time, the power transistor 11 is on.

On the other hand, as the load current increases, the potential at the supply end of the current sense resistor 2 rises, and the base-emitter voltages of the transistors 41–44 is reduced ($\Delta V_{BE}$ is increased). Then, when the load current exceeds its preset value of 10 A, $\Delta V_{BE}$ is 10 (A)×3.6044 (mΩ)=36.044 (mV); thus, the current density ratio of the transistor sections 3 and 4 is 4:1 as described in "Operation of the Invention" herein. In the present embodiment, because the effective emitter area ratio of the transistor sections 3 and 4 is 1:4, $I_1$ has eventually the same value as that of $I_2$, so that the current flowing from the transistor 63 to the second transistor section 4 is reduced to zero, causing the power transistor to turn off to block the load current.

Note that the electrolytic copper foil as per MIL-T-55561 has a specific resistance of 0.15940 $\Omega \cdot g/m^2$ if the purity of copper is more than 95%. This means that to obtain 3.6 mΩ, a pattern measuring 3 mm by 20.8 mm may be formed on a 35 μm thick copper foil printed circuit board. Copper with 97% purity at a temperature of 20° C. has a temperature coefficient of 0.00381, and 95%-purity copper may be considered equivalent to 97%-purity copper. Then, a theoretical value of the temperature coefficient of $\Delta V_{BE}$ is 1/293, i.e., 0.003413; thus, assuming that the resistance of the current sense resistor is R, the voltage thereacross is V, the current flowing therethrough is I, then I=V (1+0.003413T)/ (R (1+0.00381T), so that dI/dT=0.000397 (0.0397%/degrees).

In this way, because the bandgap voltage has a positive temperature coefficient, a great deal of latitude is available in material choice for the current sense resistor, so a copper foil may be used, for example. If a copper foil is used, its temperature coefficient is very close relative to the bandgap voltage as described above, so that overcurrent can be detected with a high degree of accuracy over a range of temperature fluctuations; furthermore, the current sense resistor can be formed on a printed circuit board, and an IC including the transistor sections 3 and 4 may be inserted into the printed circuit board for connection to the copper foil, thereby facilitating its fabrication.

Thus, according to the present invention, overcurrent can be detected accurately with a simple circuit, even at a low voltage drop, while the necessity for any voltage comparator or reference power supply with a small offset voltage is eliminated.

Although the effective emitter area ratio of the first transistor section 3 to the second transistor section 4 is not limited to 1:4, the value of $\Delta V_{BE}$, when the same current is conducted through both the transistors 3 and 4, tends to be gradual relative to an increase in N once the value of N exceeds 4, as described in the "Operation of the Invention"; as such, N is desirably equal to or greater than 4. In this case, because changes in $\Delta V_{BE}$ are gradual relative to changes in the value of N, there is an advantage that reduction in detection accuracy is minimized in terms of design errors for the effective emitter area ratio of the transistor sections 3 and 4.

It should be appreciated that transistors used in the transistor sections 3 and 4 are not limited to NPN transistors, but PNP transistors may also be used; alternatively, when field-effect transistors are used, the voltage difference between the transistor sections 3 and 4 in terms of voltage between their gate and cathode may be utilized to detect an overcurrent.

Figure 6:
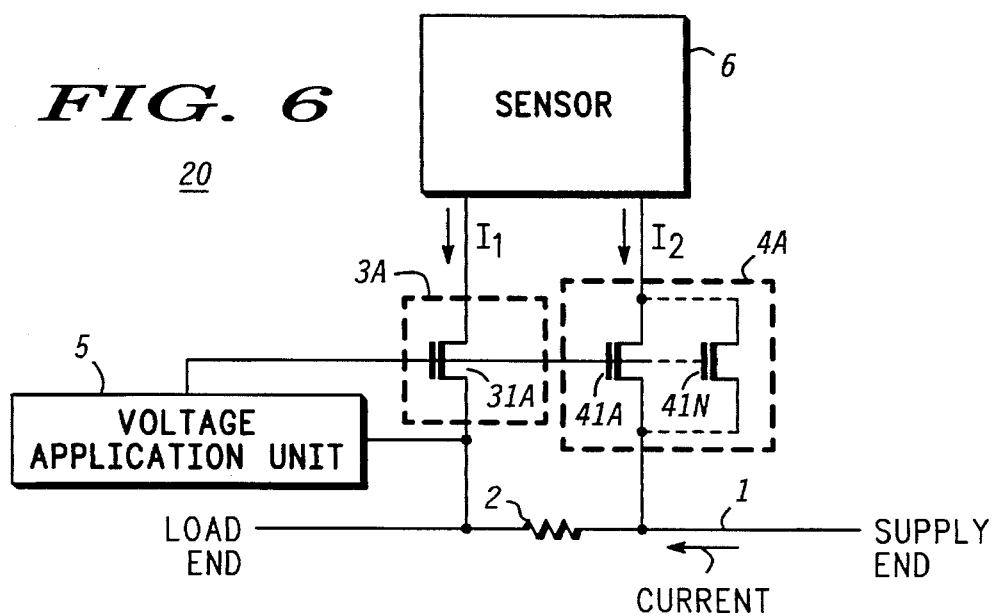
FIG. 6 is a schematic diagram of an overcurrent sense circuit in accordance with yet another embodiment of the present invention.

FIG. 6 is a circuit diagram of an overcurrent sense circuit 20 for detecting when an overcurrent flows in a load current conduction path 1 in accordance with another embodiment of the present invention. It should be understood that the same reference numerals are used in the figures to denote the same elements. Overcurrent sense circuit 20 includes a transistor section 3A having two current conducting electrodes and a control electrode. By way of example, transistor section 3A is comprised of a field effect transistor 31A, wherein the source and drain electrodes of transistor 31A serve as the current conducting electrodes of transistor section 3A and the gate electrode of transistor 31A serves as the control electrode of transistor section 3A. In addition, overcurrent sense circuit 20 includes a transistor section 4A having two current conducting electrodes and a control electrode. By way of example, transistor section 4A is comprised of a plurality of field effect transistors 41A–41N, each field effect transistor 41A–41N having a source electrode, a drain electrode, and a gate electrode. The source electrodes of each field effect transistor 41A–41N are commonly coupled to form one of the current conducting electrodes of transistor section 4A. The drain electrodes of each field effect transistor 41A–41N are commonly coupled to form the second current conducting electrode of transistor section 4A. The gate electrodes of each field effect transistor 41A–41N are commonly coupled to form the control electrode of transistor section 4A. The control electrode of transistor section 3A (i.e., the gate electrode of transistor 31A) is connected to the control electrode of transistor section 4A (i.e., the commonly coupled gate electrodes of transistors 41A–41N). It should be understood that the number of transistors within transistor section 4A is not a limitation of the present invention.

A current sense resistor is coupled between the source electrode of field effect transistor 31A (i.e., one of the current conducting electrodes of transistor section 3A) and the commonly coupled source electrodes of field effect transistors 41A–41N (i.e., one of the current conducting electrodes of transistor section 4A). It should be noted that current sense resistor 2 is provided in load current conduction path 1.

A voltage application unit 5 is coupled between the gate electrode of transistor 31A and the source electrode of transistor 31A, wherein voltage application unit 5 provides a gate-to-source voltage for transistor 31A. A sensor 6 is coupled to the drain electrode of transistor 31A and to the commonly coupled drain electrodes of transistors 41A–41N. Sensor 6 detects an overcurrent as a voltage across current sense resistor 2 based on the current of transistor section 3A (i.e., the drain current of transistor 31A) and the current of transistor section 4A (i.e., the sum of the drain currents of transistors 41A–41N).

Thus, the present invention offers an advantage that an overcurrent can be detected with small power consumption and at a high level of accuracy.

What is claimed:

1. An overcurrent sense circuit for detecting when an overcurrent flows through a load current conduction path, comprising:

a current sense resistor provided in said conduction path;

a first transistor section, comprised of a bipolar transistor, having its emitter connected to a load end of the current sense resistor;

a second transistor section, comprised of a bipolar transistor, having its emitter connected to a supply end of the current sense resistor, and its base commonly connected to a base of the first transistor section;

a voltage application unit for applying a voltage between each base and emitter of the first and second transistor sections; and a sensor for detecting the overcurrent as a voltage across the current sense resistor, based on the collector current of the first transistor section and the collector current of the second transistor section.

2. An overcurrent sense circuit according to claim 1, wherein the first and second transistor sections have different effective areas of their emitters.

3. An overcurrent sense circuit according to claim 1, wherein the first and second transistor sections comprise different numbers of transistors, each transistor having the same characteristics.

4. An overcurrent sense circuit for detecting when an overcurrent flows through a load current conduction path, comprising:

a current sense resistor provided in said conduction path;

a first transistor section, comprised of a field-effect transistor, having its cathode connected to a load of the current sense resistor;

a second transistor section, comprised of a field-effect transistor, having its cathode connected to a supply end of the current sense resistor, and its gate commonly connected to a gate of the first transistor section;

a voltage application unit for applying a voltage between each gate cathode of the first and second transistor sections; and a sensor for detecting the overcurrent as a voltage across the current sense resistor, based on a drain current of the first transistor section and a drain current of the second transistor section.

* * * * *